United States Patent [19]

Mori et al.

[11] Patent Number: 4,857,989
[45] Date of Patent: Aug. 15, 1989

[54] SEMICONDUCTOR DEVICE

[75] Inventors: Ryuichiro Mori; Katsuyuki Fukudome; Toshinobu Banjo, all of Hyogo, Japan

[73] Assignee: Mitsubishi Denki Kabushiki Kaisha, Tokyo, Japan

[21] Appl. No.: 93,524

[22] Filed: Sep. 4, 1987

[30] Foreign Application Priority Data

Sep. 4, 1986 [JP] Japan .................. 61-210317
Sep. 8, 1986 [JP] Japan .................. 61-212090

[51] Int. Cl.⁴ .................. H01L 23/14; H01L 23/18; H01L 23/32
[52] U.S. Cl. .................. 357/80; 357/72; 357/68
[58] Field of Search .................. 357/72, 74, 70, 68, 357/55, 80

[56] References Cited

U.S. PATENT DOCUMENTS

| 4,589,010 | 5/1986 | Tateno et al. | 357/72 |
| 4,712,129 | 12/1987 | Orcutt | 357/72 |

FOREIGN PATENT DOCUMENTS

| 0162246 | 12/1980 | Japan | 357/72 |
| 56-104459 | 8/1981 | Japan | 357/55 |
| 14557 | 6/1983 | Japan | |
| 0148438 | 9/1983 | Japan | |
| 61055 | 1/1984 | Japan | |
| 177594 | 2/1984 | Japan | |
| 0061055 | 4/1984 | Japan | 357/72 |
| 169260 | 10/1984 | Japan | |
| 177953 | 11/1984 | Japan | |
| 747 | 7/1985 | Japan | |
| 118252 | 11/1985 | Japan | |
| 123162 | 4/1986 | Japan | |
| 8934 | 5/1986 | Japan | |

Primary Examiner—Rolf Hille
Assistant Examiner—S. V. Clark
Attorney, Agent, or Firm—Lowe, Price, Leblanc, Becker & Shur

[57] ABSTRACT

A semiconductor element mounting member which is a mounting portion of a lead frame is provided with a concave portion having a smaller area than that of the lower surface of a semiconductor element, the area being less than $4 \times 4$ mm². The concave portion is filled with a bonding material, and the semiconductor element and the semiconductor element mounting member are bonded by the bonding material.

10 Claims, 5 Drawing Sheets

SEMICONDUCTOR DEVICE

BACKGROUND OF THE INVENTION

1. Field of the Invention

The present invention relates to a semiconductor device and more particularly, to a bonding structure of a semiconductor element and a semiconductor element mounting member.

2. Description of the Prior Art

A bonding structure of a semiconductor element and a semiconductor element mounting member is known in, for example, Japanese Patent Laying-Open Gazettes No. 14557/1983, No. 61055/1984, No. 169160/1984, No. 177953/1984, No. 177594/1984, No. 747/1985, No. 8934/1986 and No. 123162/1986, and Japanese Utility Model Laying-Open Gazette No. 118252/1985. Japanese Patent Laying-Open Gazette No. 14557/1983 discloses a semiconductor device in which a semiconductor chip mounted on a die attach portion of a lead frame is resin molded, characterized by providing a through hole in the die attach portion. Japanese Patent Laying-Open Gazette No. 61055/1984 discloses a semiconductor device wherein a concave portion is formed on a mounting substrate and a semiconductor chip is mounted to cover the concave portion through a mounting material with which the concave portion is filled. Japanese Patent Laying-Open Gazette No. 169160/1984 discloses a semiconductor device wherein a tub to which a pellet is attached is provided with an elongate transparent hole for separating a pellet attaching portion from a tub lead. Japanese Patent Laying-Open Gazette No. 177953/1984 discloses a semiconductor device wherein a groove for absorbing a stress is formed in the corner portion on the lower surface of a bed on which a semiconductor pellet is mounted, to disperse a stress which is produced at the time of heat tratment so that occurrence of a crack is prevented. Japanese Patent Laying-Open Gazette No. 177954/1984 discloses a semiconductor device wherein a concave portion for absorbing a stress is formed in the peripheral region on the lower surface of a bed on which a semiconductor pellet is mounted, to absorb a stress which is produced at the time of heat treatment in the concave portion so that occurrence of a crack is prevented. Japanese Patent Laying-Open Gazette No. 747/1985 discloses a resin molder IC package wherein the bonding area of a die lead frame on the bottom surface of an IC chip is limited to be smaller than the base area of the IC chip. Japanese Patent Laying-Open Gazette No. 8934/1986 discloses a semiconductor device wherein a large-sized pellet is attached to a pellet attaching surface by a bonding material, characterized in that a plurality of grooves are formed on at least one of the rear surface of the pellet and the pellet attaching surface. Japanese Patent Laying-Open Gazette No. 123162/1986 discloses a lead frame wherein through holes are provided in portions to be resin molded of a bed supporting portion and a lead portion and a lot of concave portions are provided on the rear surface of a bed portion so that a peripheral edge of the bed portion has a complicated concave and convex shape and the portion to be resin molded of the bed supporting portion is wound. Japanese Utility Model Laying-Open Gazette No. 118252/1985 discloses a lead frame for resin molded semiconductor having a disk shaped island with a semiconductor chip being disposed on one surface of the island and a plurality of leads extending outward from the vicinity of the island, characterized in that the other surface of the island has a concave portion or a feed-through portion.

FIGS. 1 and 3 are plan views showing the vicinity of a semiconductor element mounting portion of a conventional semiconductor device, FIG. 2 is a cross-sectional view showing a semiconductor device taken along a line I—I shown in FIG. 1, FIG. 4 is a cross-sectional view showing a semiconductor device taken along a line II—II shown in FIG. 3. In FIGS. 1 to 4, a semiconductor element 1 is mounted on a semiconductor element mounting member 2 which is a mounting portion of a lead frame and bonded by a bonding material 3. Each bonding electrode 4 of the semiconductor element 1 is wire-bonded to an external terminal 6 by a wiring material 5.

The semiconductor element 1 has recently been large-scaled. In order to improve the heat dissipation characteristic, the semiconductor element mounting member 2 is formed of a copper or copper containing material. Since coefficient of thermal expansion of a copper or copper containing material is much different from that of the semiconductor element, there is a problem that if the entire surface of the semiconductor element 1 is bonded by the bonding material 3 as shown in FIGS. 1 and 2, a thermal stress is produced as the temperature changes after bonding, so that a crack occurs in the semiconductor element 1.

Furthermore, when in order to prevent the crack, the semiconductor element 1 is partially bonded as shown in FIGS. 3 and 4, a stress is reduced. However, since the semiconductor element 1 is partially floating from the semiconductor element mounting member 2, the semiconductor element 1 may incline before the bonding material is solidified. In such a case, the wiring material 5 can not be stably attached to the semiconductor element 1.

SUMMARY OF THE INVENTION

A primary object of the present invention is to reduce a stress applied to a semiconductor element and to provide a semiconductor device in which the semiconductor element never inclines and floats relative to a semiconductor element mounting portion.

Briefly stated, the present invention is directed to a semiconductor device comprising a semiconductor element having one surface, a semiconductor element mounting member having one surface on which a concave portion is provided, the concave portion having a smaller area than that of the one surface of the semiconductor element and the semiconductor element being mounted on the one surface surrounding the concave portion, and a bonding material set in the concave portion of the semiconductor element mounting member for bonding the semiconductor element to the semiconductor element mounting member. Preferably, the area of the concave portion is less than $4 \times 4$ mm$^2$.

According to the present invention, since the bonding area of the semiconductor element is smaller than the area of the semiconductor element, and the semiconductor element is in close contact with the semiconductor element mounting portion, a stress caused by difference in coefficient of thermal expansion can be reduced and the semiconductor element never inclines and floats relative to the semiconductor element mounting portion.

Additionally, according to another embodiment, an opening is formed in the semiconductor element mounting member, a bonding material supporting member for supporting a bonding material is provided in the opening, and the bonding material supporting member is smaller than the opening and located lower than one surface of the semiconductor element mounting member. In addition, according to still another embodiment, a groove is provided over the circumference of the bonding material supporting member. Furthermore, according to still another embodiment, a feed-through hole is provided almost over the circumference of the bonding material supporting member. Thus, when the semiconductor element is mounted on the semiconductor element mounting member, excessive bonding materials flow into the groove or the feed-through hole, so that the bonding material never penetrates into a space between the semiconductor element and the semiconductor element mounting member.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
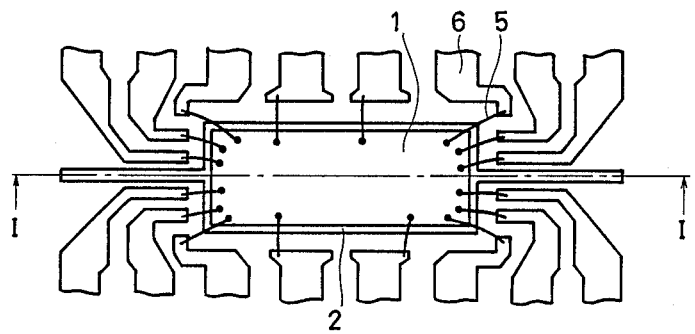
FIGS. 1 and 3 are plan views showing the vicinity of a semiconductor element mounting member of a conventional semiconductor device.
Figure 2:
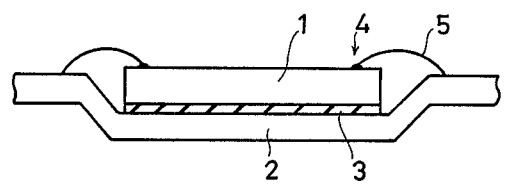
FIG. 2 is a cross-sectional view showing a semiconductor device taken along a line I—I shown in FIG. 1.
Figure 3:
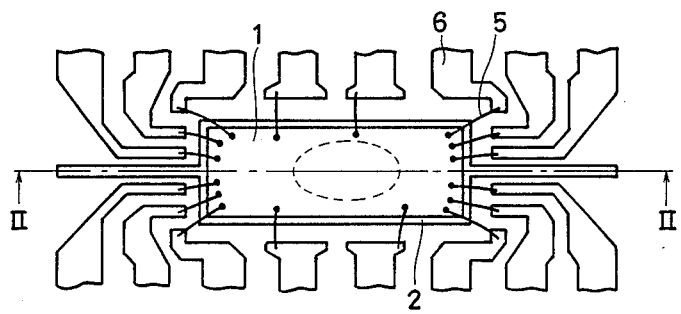
Figure 4:
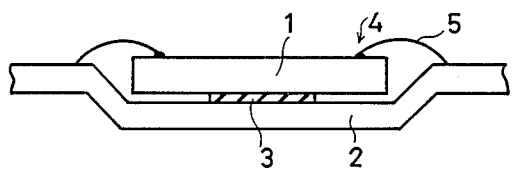
FIG. 4 is a cross-sectional view showing a semiconductor device taken along a line II—II shown in FIG. 3.
Figure 5:
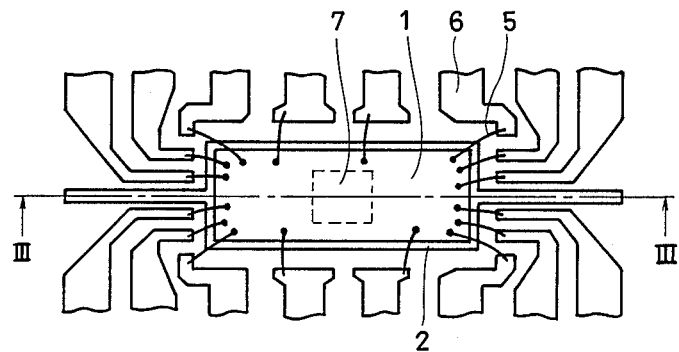
FIG. 5 is a plan view showing the vecinity of a semiconductor element mounting member of a semiconductor device according to a first embodiment of the present invention.
Figure 6:
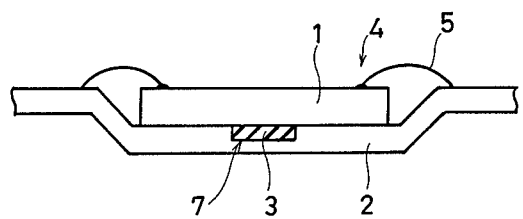
FIG. 6 is a cross-sectional view showing a semiconductor device taken along a line III—III shown in FIG. 5.

FIG. 5 is a plan view showing the vicinity of a semiconductor element mounting member of a semiconductor device according to a first embodiment of the present invention, and FIG. 6 is a cross-sectional view showing a semiconductor device taken a line III—III shown in FIG. 5. As shown in FIGS. 5 and 6, a single concave portion 7 having a smaller area than that of the lower surface of a semiconductor element 1 is provided on the upper surface of a semiconductor element mounting member 2. The concave portion 7 is filled with a suitable amount of bonding material 3, and the semiconductor element 1 is mounted on the bonding material 3 and lightly pressed. The bonding material 3 is then dried and solidified. Each bonding electrode 4 of the semiconductor element 1 is then wire-bonded to an external terminal 6 by a wiring material 5. The concave portion 7 is filled with the bonding material 3 having almost the same volume as that of the concave portion 7, on which the semiconductor element 1 is mounted, so that the semiconductor element 1 can be bonded to the semiconductor element mounting member 2 with almost the same bonding area than the area of the concave portion 7. If the area of the concave portion 7 is more than $4 \times 4$ mm$^2$, a crack is liable to occur in the semiconductor element 1, so that it is desirable that the area is less than $4 \times 4$ mm$^2$. In the present embodiment, since the bonding area in less than $4 \times 4$ mm$^2$ and smaller than the surface area of the semiconductor element 1, a stress caused by difference in coefficient of thermal expansion can be reduced. In addition, since a region other than the bonding portion on the lower surface of the semiconductor element 1 is in close contact with the upper surface of the semiconductor element mounting member 2, the semiconductor element 1 never inclines and floats relative to the semiconductor element mounting member 2.

Figure 7:
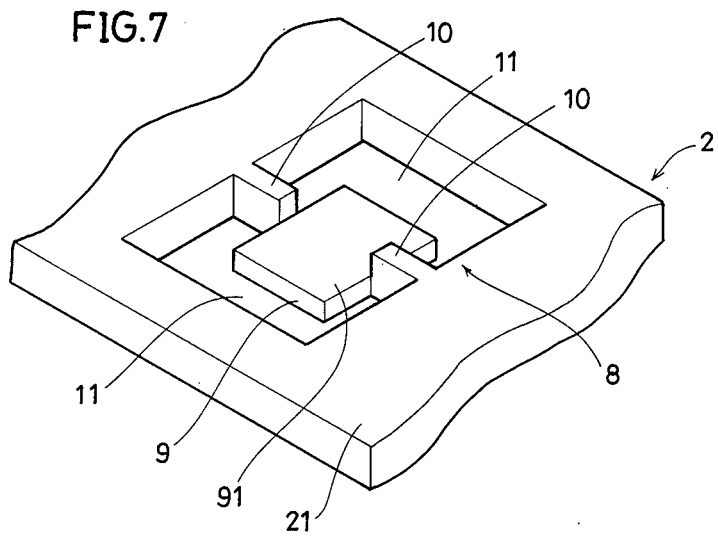
FIG. 7 is an enlarged perspective view showing a semiconductor element mounting member used in a second embodiment of the present invention.
Figure 8:
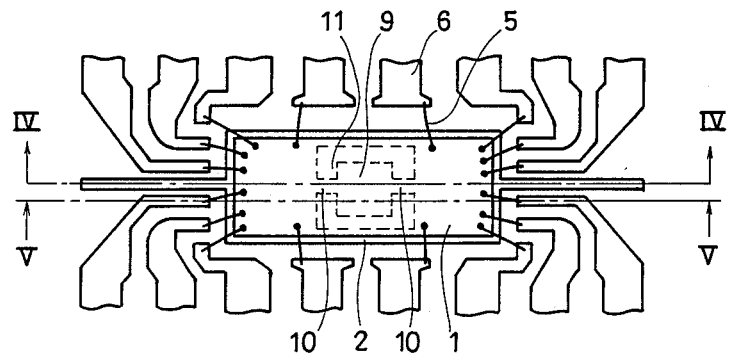
FIG. 8 is a plan view showing the vicinity of a semiconductor element mounting member of a semiconductor device according to the second embodiment of the present invention, to which a semiconductor element mounting member shown in FIG. 7 is applied.
Figure 9:
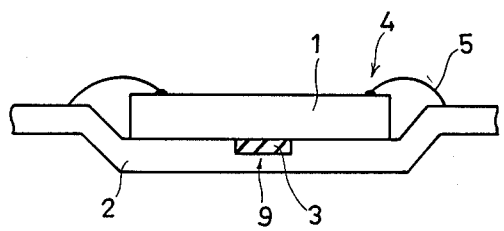
FIG. 9 is a cross-sectional view showing a semiconductor device taken along a line IV—IV shown in FIG. 8.
Figure 10:
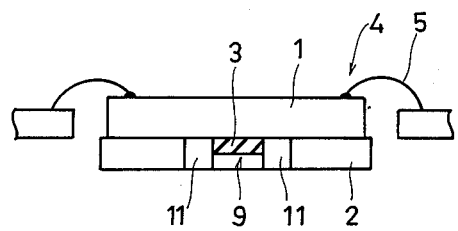
FIG. 10 is a cross-sectional view showing a semiconductor device taken along a line V—V shown in FIG. 8.

FIG. 7 is an enlarged perspective view showing a semiconductor elememt mounting member used in a second embodiment of the present invention, FIG. 8 is a plan view showing the vicinity of a semiconductor element mounting member of the semiconductor element according to the second embodiment of the present invention, FIG. 9 is a cross-sectional view showing a semiconductor device taken along a line IV—IV in FIG. 8, and FIG. 10 is a cross-sectional view showing a semiconductor device taken along a line V—V shown in FIG. 8.

In FIG. 7, the semiconductor element mounting member 2 is provided with an opening 8 of an almost square shape. A bonding material supporting member 9 is provided almost in the center of the opening 8, and connected to the semiconductor element mounting member 2 through a connecting portion 10. Similarly to the above described first embodiment, it is desirable that the area of an upper surface 91 of the bonding material supporting member 9 is less than $4 \times 4$ mm$^2$. The upper surface 91 of the bonding material supporting member 9 is located lower than an upper surface 21 of the semiconductor element mounting member 2. The bonding material 3 is mounted on the upper surface 91. A feed-through hole 11 is provided around the bonding material supporting member 9 except for the connecting portion 10. The opening 8 and the bonding portion supporting member 9 are not limited to have a square shape. The opening 8 and the bonding portion supporting member 9 may have any shape.

As shown in FIGS. 8 to 10, the semiconductor element 1 is mounted on the semiconductor element mounting member 2 to cover the opening 8. The semiconductor element 1 and the semiconductor element mounting member 2 are bounded by the bonding material 3 filled on the bonding material supporting member 9. Since the feed-through hole 11 is provided around the bonding material supporting member 9, the bonding material 3 never infiltrates into a space between the semiconductor element 1 and the semiconductor element mounting member 2 when the semiconductor element 1 is mounted on the semiconductor element mounting member 2 and lightly pressed. Thus, the present embodiment has an advantage that the bonding area of the semiconductor element 1 and the semiconductor element mounting member 2 is constant. Similarly to the first embodiment, a stress caused by difference in thermal expansion can be reduced and the semiconductor element 1 never floats and inclines relative to the semiconductor element mounting member 2.

Figure 11:
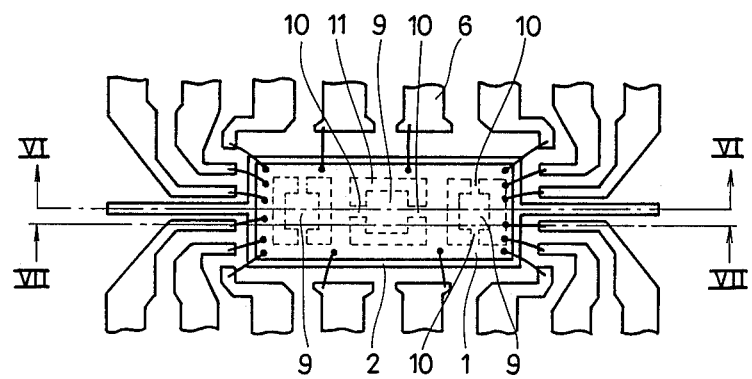
FIG. 11 is a plan view showing the vicinity of a semiconductor element mounting member of a semiconductor device according to a third embodiment of the present invention, in which a plurality of bonding structures shown in FIG. 7 are provided.
Figure 12:
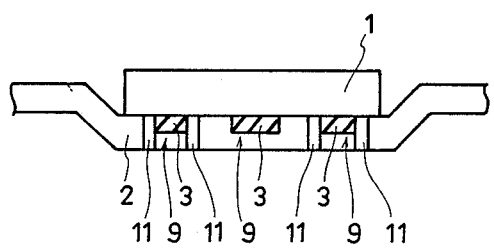
FIG. 12 is a cross-sectional view showing a semiconductor device taken along a line VI—VI shown in FIG. 11.
Figure 13:
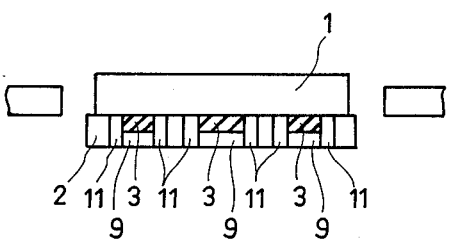
FIG. 13 is a cross-sectional view showing a semiconductor device taken along a line VII—VII shown in FIG. 11.

FIG. 11 is a plan view showing the vicinity of a semiconductor element mounting member of a semiconductor device according to a third embodiment of the present invention, in which a plurality of bonding structures shown in FIG. 7 are provided, FIG. 12 is a cross-sectional view showing a semiconductor device taken along a line VI—VI shown in FIG. 11, and FIG. 13 is a cross-sectional view showing a semiconductor device taken along a line VII—VII shown in FIG. 11. According to the embodiment shown in FIGS. 11 to 13, the semiconductor element 1 and the semiconductor element mounting member 2 are bonded in three regions. In the present embodiment, the same effect as that in the second embodiment can be obtained.

Figure 14:
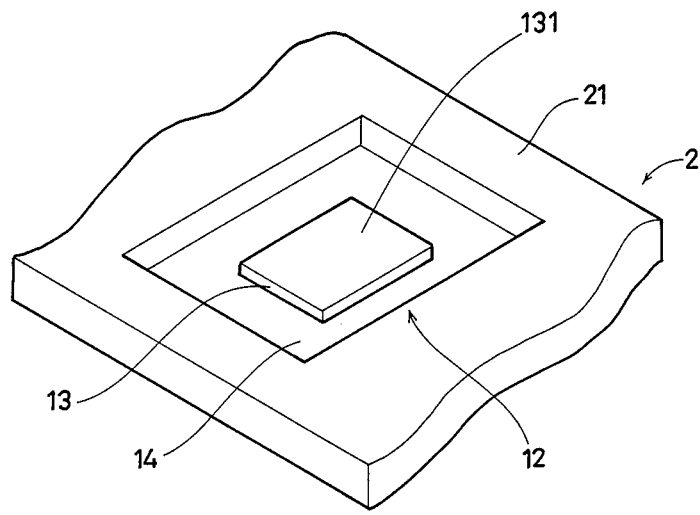
FIG. 14 is an enlarged perspective view showing a semiconductor element mounting member used in a fourth embodiment of the present invention.
Figure 15:
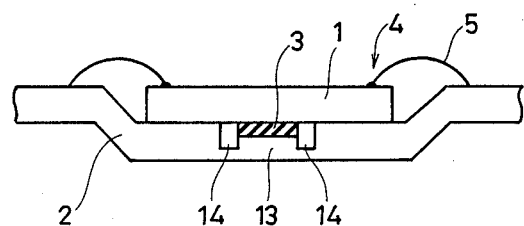
FIG. 15 is a cross-sectional view showing the vicinity of a semiconductor element member of a semiconductor device according to the fourth embodiment of the present invention, to which the semiconductor element mounting member shown in FIG. 14 is applied.

FIG. 14 is an enlarged perspective view showing a semiconductor element mounting member used in a fourth embodiment of the present invention, and FIG. 15 is a cross-sectional view showing the vicinity of a semiconductor element mounting member of a semiconductor device according to a fourth embodiment of the present invention, to which the semiconductor element mounting member shown in FIG. 14 is applied.

In FIG. 14, a semiconductor element mounting member 2 is provided with an opening 12 of an almost square shape. A bonding material supporting member 13 is provided almost in the center of the opening 12, and a groove 14 is provided around the bonding material supporting member 13. Similarly to the above described embodiments, it is desirable that the area of an upper surface 131 of the bonding material supporting member 13 is less than 4×4 mm². In addition, the upper surface 131 of the bonding material supporting member 13 is located lower than the upper surface 21 of the semiconductor element mounting member 2, and the bonding material 3 is mounted on the upper surface 131. Similarly to the above described embodiments, the opening 12 and the bonding material supporting member 13 may have any shape. Similarly to the above described second and third embodiments, since the groove 14 is provided around the bonding material supporting member 13, the bonding material never infiltrates into a space between the semiconductor element 1 and the semiconductor element mounting member 2 when the semiconductor element 1 is mounted on the semiconductor element mounting member 2 and lightly pressed. Furthermore, similarly to the above described embodiments, a stress caused by difference in thermal expansion can be reduced and the semiconductor element 1 never floats and inclines relative to the semiconductor element mounting member 2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A semiconductor device comprising:
    a semiconductor element having a mounting surface,
    a semiconductor element mounting member having an upper surface on which a concave portion is provided, said concave portion having a substantially smaller area than an area of the mounting surface of said semiconductor element, said semiconductor element mounted on said upper surface and completely covering and surrounding said concave portion, and
    a bonding material set in said concave portion of said semiconductor element mounting member for bonding said semiconductor element to said semiconductor element mounting member so that a portion of said semiconductor element surrounding said concave portion floats on, but is not attached to, a portion of said upper surface of said semiconductor mounting member sorrounding said convex portion, a volume of said bonding material being substantially equal to a volume of said concave portion.
2. A semiconductor device in accordance with claim 1, wherein
    the area of said concave portion is less than 4×4 mm².
3. A semiconductor device in accordance with claim 1, wherein
    said semiconductor element mounting member comprises a mounting portion of a lead frame.
4. A semiconductor device in accordance with claim 3, further comprising
    an external terminal of a lead frame, said external terminal being wire-bonded to said semiconductor element.
5. A semiconductor device, comprising:
    a semiconductor element,
    a semiconductor element mounting member having an upper surface in which an opening is formed and a bonding material supporting member provided in said opening, said bonding material supporting member having a surface area substantially smaller than an area of said opening and positioned below said upper surface of said mounting member whereby a space is formed substantially around a circumference of said bonding material supporting member, said semiconductor element mounted on said upper surface completely covering said opening so that a portion of said semiconductor element surrounding said opening floats on, but is not attached to, said upper surface of said semiconductor mounting member, and a bonding material for bonding said semiconductor element only to said bonding material supporting member of semiconductor mounting member.

6. A semiconductor device in accordance with claim 5, wherein
a groove is provided over the circumference of said bonding material supporting member.

7. A semiconductor device in accordance with claim 5, wherein
a feed-through hole is provided almost over the circumference of said bonding material supporting member.

8. A semiconductor device in accordance with claim 5, wherein
the area of one surface of said bonding material supporting member in less than $4 \times 4$ mm$^2$.

9. A semiconductor device in accordance with claim 5, wherein
said semiconductor element mounting member comprises a mounting portion of a lead frame.

10. A semiconductor device in accordance with claim 9, further comprising
an external terminal of a lead frame,
said external terminal being wire-bonded to said semiconductor element.

* * * * *